United States Patent [19]
Barnett

[11] Patent Number: 5,836,790
[45] Date of Patent: *Nov. 17, 1998

[54] RADIO TELEPHONE CONNECTOR

[75] Inventor: Ricky William Barnett, Hertfordshire, England

[73] Assignee: Nokia Mobile Phones Limited, Espoo, Finland

[ * ] Notice: This patent issued on a continued prosecution application filed under 37 CFR 1.53(d), and is subject to the twenty year patent term provisions of 35 U.S.C. 154(a)(2).

[21] Appl. No.: 728,201

[22] Filed: Oct. 10, 1996

[30] Foreign Application Priority Data

Aug. 30, 1996 [GB] United Kingdom .................. 9618224

[51] Int. Cl.⁶ .................................................. H01R 13/66
[52] U.S. Cl. ........................................ 439/620; 439/500
[58] Field of Search ................................ 439/79, 80, 620; 379/433, 434, 428, 429

[56] References Cited

U.S. PATENT DOCUMENTS

| | | | |
|---|---|---|---|
| 4,845,760 | 7/1989 | Awakowicz et al. | 381/188 |
| 5,027,394 | 6/1991 | Ono et al. | 379/434 |
| 5,044,963 | 9/1991 | Kukkonen et al. | 439/55 |
| 5,057,847 | 10/1991 | Vaisanen | 343/702 |
| 5,059,131 | 10/1991 | Kukkonen et al. | 439/78 |
| 5,127,844 | 7/1992 | Leman et al. | 439/353 |
| 5,200,997 | 4/1993 | Leman | 379/428 |
| 5,268,819 | 12/1993 | Lonka | 361/785 |
| 5,371,790 | 12/1994 | Nevo et al. | 379/433 |
| 5,537,472 | 7/1996 | Estevez-Alcolado et al. | 379/433 |
| 5,538,435 | 7/1996 | Yohn | 439/188 |
| 5,548,644 | 8/1996 | Boehnke et al. | 379/428 |
| 5,586,183 | 12/1996 | Marcus et al. | 379/433 |

FOREIGN PATENT DOCUMENTS 0 299 162   1/1989   European Pat. Off. .
2 226 457   6/1990   United Kingdom .

*Primary Examiner*—Neil Abrams
*Assistant Examiner*—T. C. Patel
*Attorney, Agent, or Firm*—Perman & Green, LLP

[57] ABSTRACT

A connector for mounting on a circuit board of a radio telephone and providing external connection to the radio telephone, comprising a first conductive track for coupling the circuit board of the radio telephone to an external connection, and a second conductive track, wherein the connector is adapted to receive a microphone of the radio telephone and maintain it in a predetermined position, in which an output terminal of the microphone contacts the second conductive track, such that the microphone is coupled to the circuit board of the radio telephone.

10 Claims, 2 Drawing Sheets

RADIO TELEPHONE CONNECTOR

BRIEF FIELD OF INVENTION

This invention relates to a connector for a radio telephone, In particular, the invention especially but not exclusively relates to a system connector for mounting on a circuit board of a radio telephone and providing external connection to the radio telephone.

BACKGROUND OF THE INVENTION

System connectors are provided in known radio telephones, particularly mobile cellular telephones, to enable external electrical connections to be made to the telephone. In a typical radio telephone the system connector is mounted onto a circuit board of the radio telephone and is connected to various electrically conductive tracks on the circuit board surface. When external connections are made to the system connector, the connector generally provides a electrical coupling between the external connection and a suitable track on the circuit board surface. A system connector may provide various types of external connection, for example, a power supply connection for charging purposes or a data connection for connecting the telephone to a computer. A power supply connection may enable electrical power to be supplied to the telephone for charging the batteries of the telephone. A data connection may enable digital or analogue electrical signals to be sent or received by the telephone. Additionally, a radio frequency (RF) connection may be provided to enable the use of an external antenna.

In known radio telephones the mouthpiece is provided with a microphone which is attached to a circuit board of the telephone by two wires. The wires extend from the microphone and are secured by spot soldering the ends of the wires to suitable tracks on the circuit board surface. This soldering process occurs in the latter stages of the radio telephone assembly as the microphone is sensitive to processes occurring earlier in assembly such as reflow soldering. The microphone connection resulting from this soldering process is not very reliable and may easily be broken through bad soldering joints.

Noise cancelling microphones have been used in some radio telephones and typically operate by responding to a pressure differential produced by sound waves being received at two different positions on the noise cancelling microphone. The two different positions on the microphone are typically the front and the back surfaces of the microphone with the sound waves reaching these positions via two separate acoustic ports. Near-field sounds such as a user's voice create a significantly greater pressure differential than far-field sounds such as background noise. In this way the near-field sounds are detected by the noise cancelling microphone in preference to the far-field noises. The two acoustic ports used by the microphone are typically provided by a hole in the front cover of the telephone and a hole in the back cover of the telephone. In another solution the two ports are provided by a hole in the front and a hole in the back of a flip element on the telephone.

SUMMARY OF INVENTION

According to a first aspect of the present invention there is provided a connector for mounting on a circuit board of a radio telephone and providing external connection to the radio telephone, comprising a first conductive track for coupling the circuit board of the radio telephone to an external connection, and a second conductive track, wherein the connector is adapted to receive a microphone of the radio telephone and maintain it in a predetermined position, in which an output terminal of the microphone contacts the second conductive track, such that the microphone is coupled to the circuit board of the radio telephone.

A connector in accordance with the first aspect of the present invention has the advantage that coupling of the microphone to the circuit board of the radiotelephone is achieved by simply placing the microphone onto the relevant track of the connector. The placement of the microphone may be provided manually or by an automated placement machine. Either way, the placement of the microphone in the connector, ideally a system connector, saves assembly time and is simpler and more reliable than the prior art method of spot soldering the microphone directly onto the circuit board. The system connector in accordance with the invention may be reflow soldered to the circuit board early on in the assembly of the radio telephone, During the same reflow solder process the conductive tracks for coupling the microphone to the circuit board may also be made to the circuit board thus saving assembly time. In prior art radio telephones this would have been troublesome as the microphone attached to the wires would be damaged by the heat from the reflow soldering process.

Another advantage of the system connector in accordance with the invention is that after placing the microphone onto a contact portion of the relevant conductive track, the system connector may also allow the microphone to be removed by simply lifting it away from the contact portion. In this way a microphone which is faulty may be replaced without having to de-solder any connections to the circuit board thus saving time and effort and reducing the risk of damage to other components on the circuit board.

Locating the microphone in the system connector may also provide the advantage that space is saved in the radio telephone which is an important consideration in the mobile telephone industry. However, the invention is not limited to the microphone being received within the system connector. The microphone may also be received on formations projecting from the top of the system connector or in any other configuration on the system connector. Ideally the microphone is received by push fitting into a recess provided on the system connector.

Preferably the conductive track for coupling the microphone to the circuit board is provided with a spring contact. The springs contacts ensures that a reliable connection is made between the microphone and the microphone tracks of the system connector.

Suitably the conductive tracks of the system connector and the output terminals of the microphone are made of metal.

Ideally the microphone is provided with output terminals in the form of two concentric contacts. These contacts allow the microphone to be placed on the contacts of the system connector without having to rotate the microphone into a correct orientation.

Suitably the microphone is located in a sound insulating elastomeric boot before being placed in the system connector. The elastomeric boot provides for a comfortable push fit of the microphone in the system connector. The elastomeric boot also ensures that the microphone is sound insulated thus allowing it to operate more effectively.

According to a second aspect of the present invention there is provided a connector for mounting on a circuit board of a radio telephone and providing external connections to the radio telephone, comprising a recess on a first surface for receiving a microphone of the radio telephone, and an acoustic port extending through the floor of the recess and emerging at a second surface of the system connector.

A system connector in accordance with the second aspect of the present invention has the advantage that no unsightly hole is required in the back cover of the telephone or the back cover of the flip element of the telephone in order to provide the benefits of the noise cancelling microphone. The system connector in accordance with the present invention also ensures a reliable and accurate positioning of the second acoustic port close to the microphone.

DETAILED DESCRIPTION OF EMBODIMENTS OF THE INVENTION

Embodiments of the invention will now be described, by way of example, with reference to the accompanying drawings.

Figure 1:
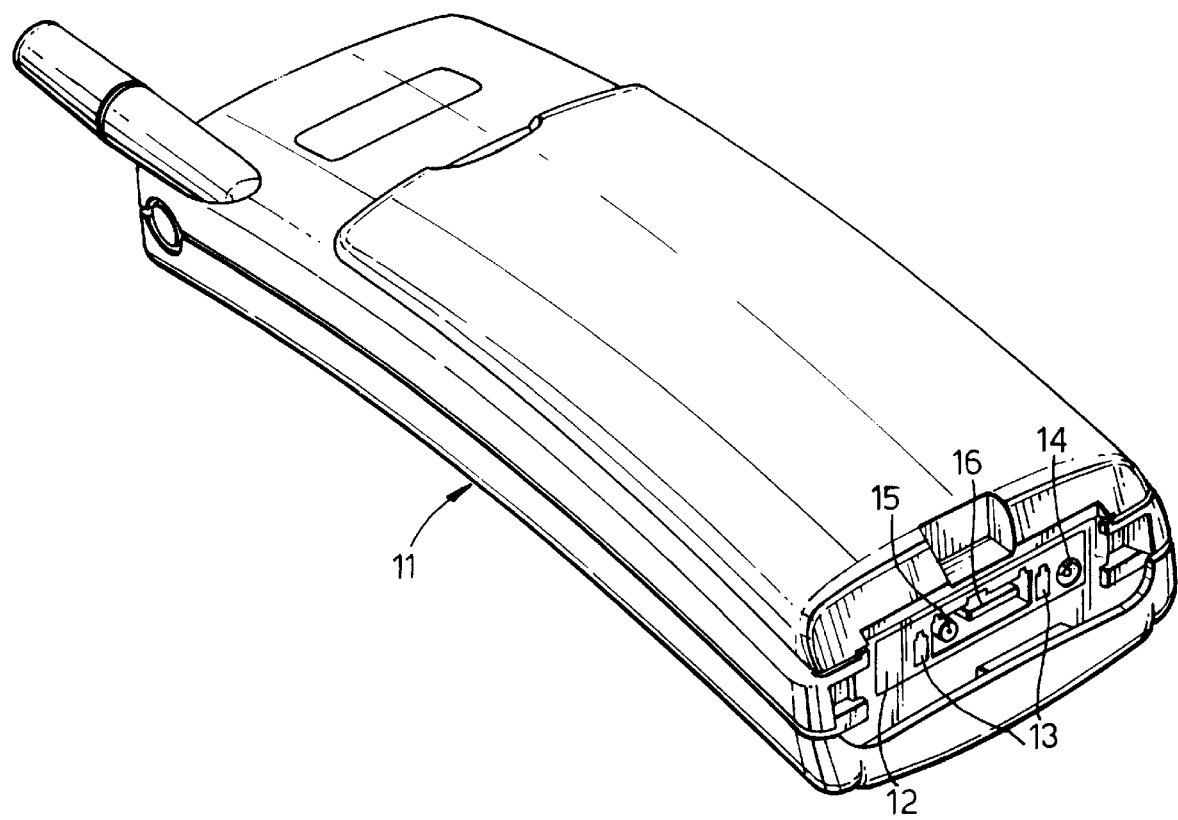
FIG. 1 is a perspective view of a radio telephone incorporating a system connector.

Referring to FIG. 1 there is shown a system connector 12 integrated into a radio telephone 11. The system connector 12 is exposed along one of its surfaces by an opening on the radio telephone housing to allow external electrical connections to be made with the system connector 12. The system connector 12 acts as a physical and electrical interface between the external connections and the circuitry of the radio telephone 11.

The system connector 12 includes four external electrical connectors 13, 14, 15, and 16. The two connectors 13 and 14 both enable a power supply connection to be made to the radio telephone 11 to provide the radio telephone 11 with electrical power. This electrical power may be used to recharge the batteries of the radio telephone 11, Connector 13 comprises two electrically conductive elements which are designed to be placed on power pins of a charger stand. Connector 14 is a socket which comprises an electrically conductive center pin and an outer electrically conductive surround and is designed to receive a plug of a charger unit. Connector 15 is an RF connector for supplying RF electrical signals to and/or from the radio telephone 11. The RF connector 15 enables an external RF connection such as an external booster antenna to be made to the radio telephone 11. Connector 16 is a data connector which has a multitude of electrically conductive elements that enable transfer of data in the form of electrical signals to and/or from the radio telephone 11.

Figure 2:
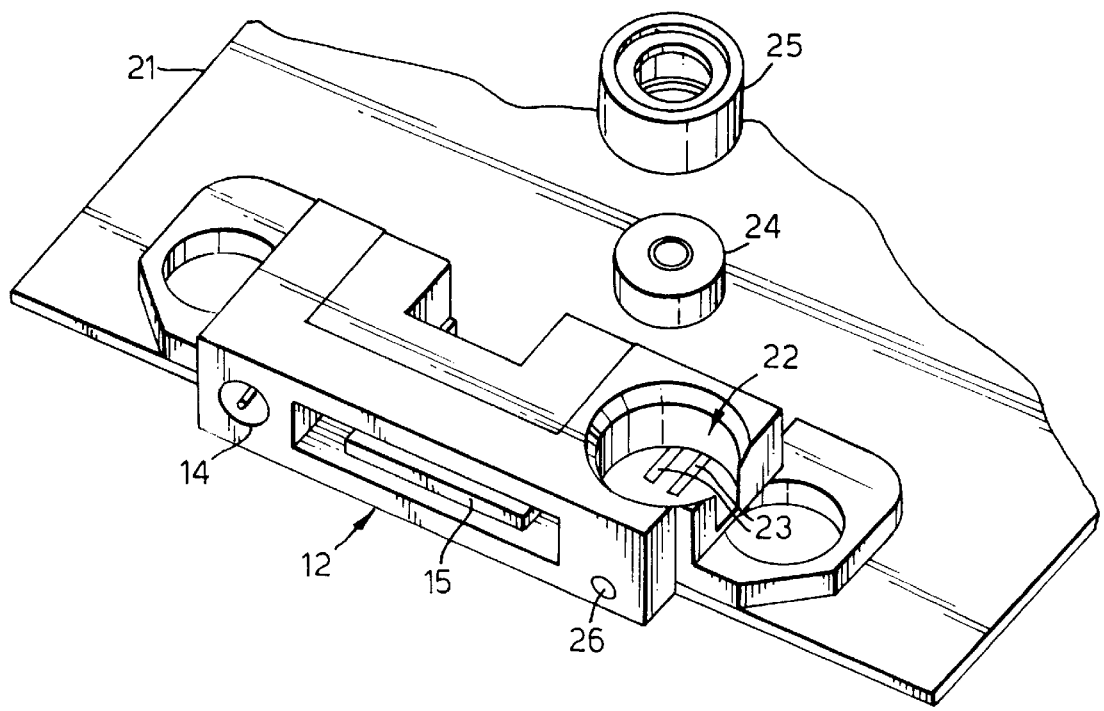
FIG. 2 is an exploded perspective view of a system connector in accordance with the invention.

Referring now to FIG. 2 there is shown a system connector 12, a circuit board 21, a microphone 24 and an elastomeric insulating boot 25. The system connector 12 comprises a power supply connector 14, a data connector 16, an acoustic port 26, a microphone recess 22, and a pair of contacts 23 for the microphone.

The connectors 14 and 15 each have electrically conductive contacts which enable external electrical connections to be made. These contacts of the connectors 14 and 15 individually form part of electrically conductive tracks which pass through the plastic body of the system connector 12. An electrically conductive tab is provided at the end of each track to enable the track to be soldered to tracks on the surface of the circuit board. In this way the contacts of the connectors 14 and 15 may be individually coupled to the appropriate tracks on the circuit board 21.

Figure 3:
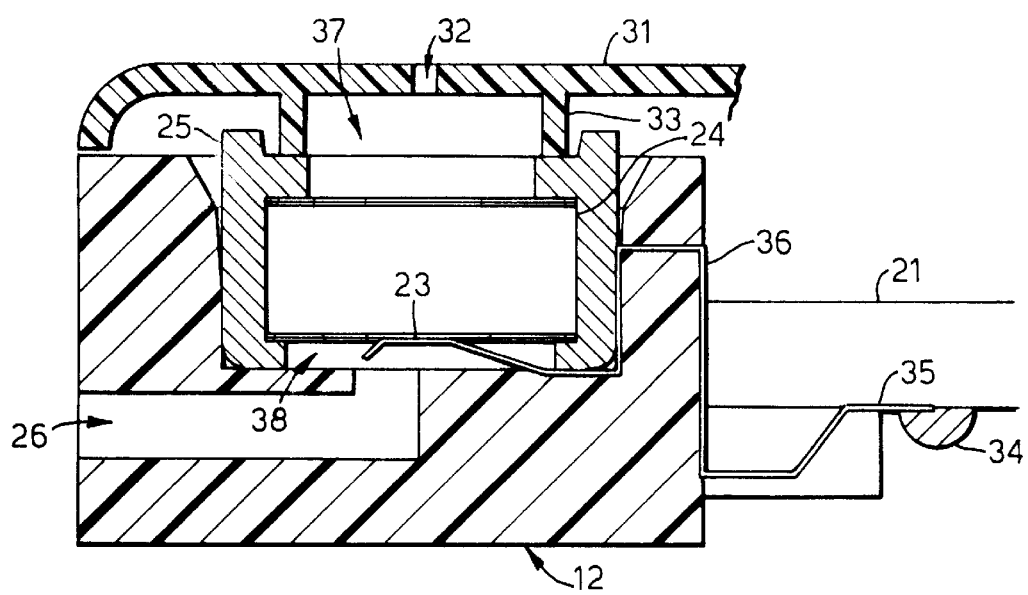
FIG. 3 is a side cross-sectional view of the system connector of FIG. 2.

The system connector 12 is provided with a recess 22 for receiving the microphone 24. Before inserting the microphone 24 into the system connector 12, the microphone 24 is first placed inside the elastomeric boot 25. The elastomeric boot 25 containing the microphone 24 is then push fitted inside the recess 22 until a snug fit of the boot 25 in the recess 22 is achieved as shown in FIG. 3. The elastomeric boot 25 serves to secure the microphone 24 into the recess 22 and to maintain the microphone 24 in the correct position within the recess 22. The elastomeric boot 25 also provides sound insulation for the microphone 24.

The microphone contacts 23 of the system connection 12 automatically couple to the microphone 24 when the microphone 24 and boot 25 are push fitted into the recess. Concentric electrically conductive contacts are provided as output terminals of the microphone 24 to enable the microphone 24 to electrically contact with the contacts 23 irrespective of the rotational orientation of the microphone 24 in the recess 22. The contacts 23 are in the form of metal spring contacts which are biased towards the microphone output terminals to ensure that a good electrical contact is maintained. Each contact 23 forms part of an electrically conductive track 36 which passes through the system connector 12 to an electrically conductive tab 35. The tabs 35 enable the each track to be soldered 34 onto an appropriate microphone track on the surface of the circuit board.

The two microphone tracks 36 and the tracks of the connectors 14 and 15 when soldered to the circuit board provide a suitable mounting of the system connector 12 to the circuit board 21. During assembly of the radio telephone 11, the system connector 12 may be positioned on the circuit board 21 by a pick and place machine and then soldering of the microphone tracks 36 and the connector tracks 14 and 15 to the circuit board 21 may be performed using reflow soldering techniques.

A front cover 31 of the radio telephone 11 is placed over the system connector 12, microphone 24, and boot 25, as shown in FIG. 3. The presence of the front cover 31 and the cylindrical wall 33 forms an acoustic cavity 37 above the microphone 24. The hole 32 in the front cover 31 acts as an acoustic port to allow sound waves, typically from a voice, to enter the acoustic cavity 37 through the front cover 31 of the telephone 11 and be received by the microphone 24. A sound proof gasket seal is formed by the cylindrical wall 33 acting against the elastomeric boot 25 preventing additional noise from entering the acoustic cavity 37 and being received by the microphone 24.

The front cover 31, the system connector 12, and the boot 25 encapsulate the microphone 24 so that it is enclosed within the telephone 11.

In addition to the acoustic port 32, a second acoustic port 26 is provided in the system connector 12. The second acoustic port 26 is provided as a hole in the body of the system connector as shown in FIGS. 2 and 3. The entrance of the second acoustic port 26 is on the exposed face of the system connector 12. The acoustic port 26 continues through the system connector 12 and then deviates upwards before emerging in a second acoustic cavity 38. This acoustic cavity 38 is formed by the gap between the lower surface of the microphone 24 and the system connector 12 which is caused by the lower flange of the elastomeric boot 25. This second acoustic port 26 allows sound waves incident on the exposed surface of the system connector 12 to enter the second acoustic cavity 38. If a noise cancelling microphone is used for microphone 24 then sounds waves entering the second acoustic cavity are received by the lower, noise cancelling surface of the microphone 24. The complete assembly therefore enables a noise cancelling microphone to operate using the two separate acoustic ports 26 and 32 without the need for any holes to be formed in the rear cover of the radio telephone 11. However, a non-noise cancelling microphone may equally be used with the second acoustic port present without any adverse affects on the performance of the non-noise cancelling microphone 24.

The present invention includes any novel feature or combination of features disclosed herein either explicitly or any generalisation thereof irrespective of whether or not it relates to the claimed invention or mitigates any or all of the problems addressed.

In view of the foregoing description it will be evident to a person skilled in the art that various modifications may be made within the scope of the invention. art that various modifications may be made within the scope of the invention. For example, the spring contacts for the microphone connection need not necessarily be on the system connector but may instead be on output terminals of the microphone. The invention is also suitable for use in other electronic devices other than radio telephones such as personal organisers.

What I claim is:

1. A connector having a body made from an insulated material for mounting on a circuit board of a radio telephone and providing external connection to the radio telephone, said radio telephone having a housing and said connector body being exposed along one of its surfaces by an opening in the radio telephone housing to allow external electrical connections to be made with the connector, said connector comprising:

a first conductive track disposed within and through the connector body and having one end for coupling the first conductive track to an external connection and having another end with a tab connectable to the circuit board of the radio telephone, and a second conductive track disposed within and through the connector body and having one end for coupling the second conductive track to a microphone and having another end with a tab connectable to the circuit board of the radio telephone, wherein the connector includes means for receiving the microphone of the radio telephone and for maintaining the microphone in a predetermined position, and in which position an output terminal of the microphone contacts the second conductive track in the general vicinity of said one end thereof.

2. A connector as claimed in claim 1, wherein the connector body is adapted to receive the microphone in a recess of the connector body.

3. A connector as claimed in claim 1, wherein the second conductive track is provided with a spring contact for contacting the output terminal of the microphone.

4. A connector as claimed in claim 1, wherein the first and second conductive tracks are adapted for soldering onto the circuit board through the intermediary of each of said tabs.

5. An assembly comprising the connector as claimed in claim 1, and the microphone, and the circuit board.

6. A connector having a body for mounting on a circuit board of a radio telephone and providing external connections to the radio telephone, said radio telephone having a housing and said connector body being exposed along one of its surfaces by an opening in the radio telephone housing to allow external electrical connections to be made with the connector, said connector comprising a recess on a first surface of said connector body and ending in a floor for receiving a microphone of the radio telephone, and an acoustic port extending through the body of said connector and communicating between the floor of the recess and a second surface of the connector, wherein said second surface is defined at least in part by said one surface exposed by said opening in the radio telephone housing.

7. An assembly comprised of a radio telephone having a housing, a circuit board and a microphone disposed within said housing and a connector having a body made from an insulated material mounted onto the circuit board of the radio telephone and providing external connection to the radio telephone, said connector body being exposed along one of its surfaces by an opening in the radio telephone housing to allow external electrical connections to be made with the connector; a first conductive track disposed within and through the connector body and having one end for coupling the first conductive track to an external connection and having another end with a tab connected to the circuit board of the radio telephone, and a second conductive track disposed within and through the connector body and having one end for coupling the second conductive track to said microphone and having another end with a tab connected to the circuit board of the radio telephone, wherein the connector includes means for receiving the microphone of the radio telephone and for maintaining said microphone in a predetermined position, and in which position an output terminal of the microphone contacts the second conductive track in the general vicinity of said one end thereof.

8. A connector as claimed in claim 7, wherein the first and second conductive tracks are soldered onto the circuit board through the intermediary of each of said tabs.

9. A connector as claimed in claim 8, wherein the second conductive track is provided with a spring contact for contacting an output terminal of the microphone.

10. A connector as claimed in claim 9, wherein said connector comprises a recess on a first surface of said connector body and ending in a floor for receiving the microphone of the radio telephone, and an acoustic port extending through the body of said connector and communicating between the floor of the recess and a second surface of the connector.

* * * * *